US006344663B1

(12) United States Patent
Slater, Jr. et al.

(10) Patent No.: US 6,344,663 B1
(45) Date of Patent: *Feb. 5, 2002

(54) SILICON CARBIDE CMOS DEVICES

(75) Inventors: David B. Slater, Jr.; Lori A. Lipkin, both of Raleigh; Alexander A. Suvorov, Durham; John W. Palmour, Raleigh, all of NC (US)

(73) Assignee: Cree, Inc., Durham, NC (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/631,926

(22) Filed: Apr. 15, 1996

Related U.S. Application Data

(60) Continuation-in-part of application No. 08/352,887, filed on Dec. 9, 1994, now Pat. No. 5,629,531, which is a division of application No. 07/893,642, filed on Jun. 5, 1992, now Pat. No. 5,459,107.

(51) Int. Cl.[7] .................... H01L 31/0312; H01L 27/01; H01L 27/12; H01L 31/0392
(52) U.S. Cl. .................... 257/77; 257/351; 257/369; 257/383; 257/769; 438/931
(58) Field of Search .................... 257/77, 351, 309, 257/303, 263, 266, 269; 438/931

(56) References Cited

U.S. PATENT DOCUMENTS

| 3,849,216 A | | 11/1974 | Salters ...................... 148/187 |
| 4,513,309 A | * | 4/1985 | Cricchi ...................... 257/376 |
| 4,608,584 A | | 8/1986 | Mihara | |
| 4,757,028 A | | 7/1988 | Kondoh et al. | |

(List continued on next page.)

FOREIGN PATENT DOCUMENTS

| EP | 0 372 412 A1 | 6/1990 | |
| EP | 0518683 A1 | 12/1992 | |
| EP | 8088283 | 2/1996 | |
| JP | 63-47983 | * 2/1988 | .................. 257/77 |
| JP | 63047983 | 2/1988 | |
| JP | 63136568 | 6/1988 | |
| JP | 4029368 | 1/1992 | |
| JP | 08088283 | 2/1996 | |
| WO | WO89/04056 | 5/1989 | |
| WO | WO93/26047 | 12/1993 | |

OTHER PUBLICATIONS

Steckl et al., "High Voltage, Temperature–Hard 3C–SiC Schottky Diodes Using All–Ni Metallization", IEDM 93, pp. 695–8, Dec. 5, 1993.*

(List continued on next page.)

*Primary Examiner*—Olik Chaudhuri
*Assistant Examiner*—Howard Weiss
(74) *Attorney, Agent, or Firm*—Myers Bigel Sibley & Sajovec

(57) ABSTRACT

A monolithic CMOS integrated device formed in silicon carbide and method of fabricating same. The CMOS integrated device includes a layer of silicon carbide of a first conductivity type with a well region of a second conductivity type formed in the layer of silicon carbide. A MOS field effect transistor is formed in the well region and a complementary MOS field effect transistor is formed in the silicon carbide layer. The method of fabrication of CMOS silicon carbide includes formation of an opposite conductivity well region in a silicon carbide layer by ion implantation. Source and drain contacts are also formed by selective ion implantation in the silicon carbide layer and the well region. A gate dielectric layer is formed by deposition and reoxidation. A gate electrode is formed on the gate dielectric such that a channel region is formed between the source and the drain when a bias is applied to the gate electrode. Source drain and body contacts are preferably formed of the same material in a single fabrication step.

18 Claims, 12 Drawing Sheets

U.S. PATENT DOCUMENTS

| | | | | |
|---|---|---|---|---|
| 4,762,806 A | | 8/1988 | Suzuki et al. | |
| 4,805,008 A | * | 2/1989 | Yao et al. | 257/376 |
| 4,812,891 A | * | 3/1989 | Bingham | 257/370 |
| 4,865,685 A | | 9/1989 | Palmour | |
| 4,897,710 A | | 1/1990 | Suzuki et al. | |
| 4,912,063 A | | 3/1990 | Davis et al. | |
| 4,912,064 A | * | 3/1990 | Kong et al. | 438/507 |
| 4,981,551 A | | 1/1991 | Palmour | |
| 4,994,413 A | | 2/1991 | Eshita | |
| 5,087,576 A | * | 2/1992 | Edmond et al. | 438/522 |
| 5,170,231 A | | 12/1992 | Fujii et al. | |
| 5,225,032 A | | 7/1993 | Golecki | |
| 5,230,768 A | | 7/1993 | Furukawa et al. | |
| 5,233,215 A | | 8/1993 | Baliga | |
| 5,247,192 A | | 9/1993 | Nii | |
| 5,264,713 A | | 11/1993 | Palmour | |
| 5,270,554 A | | 12/1993 | Palmour | |
| 5,279,701 A | | 1/1994 | Shigeta et al. | |
| 5,318,915 A | | 6/1994 | Baliga et al. | 437/24 |
| 5,322,802 A | | 6/1994 | Baliga et al. | 437/22 |
| 5,323,040 A | | 6/1994 | Baliga | |
| 5,326,991 A | * | 7/1994 | Takasu | 257/77 |
| 5,342,803 A | | 8/1994 | Shimoji | 437/70 |
| 5,385,855 A | | 1/1995 | Brown et al. | 437/41 |
| 5,396,085 A | | 3/1995 | Baliga | |
| 5,475,265 A | * | 12/1995 | Kato | 257/741 |
| 5,506,421 A | | 4/1996 | Palmour et al. | |
| 5,565,377 A | * | 10/1996 | Weiner et al. | 437/173 |
| 5,625,232 A | * | 4/1997 | Numata et al. | 257/758 |
| 5,629,531 A | * | 5/1997 | Palmour | 257/77 |
| 5,702,973 A | * | 12/1997 | Mitani et al. | 438/16 |
| 5,883,423 A | * | 3/1999 | Patwa et al. | 257/532 |

OTHER PUBLICATIONS

Saidov, M.S., et al.; *Current–voltage characteristics of silicon carbide heterojunctions*, Sov. Phys. Semicond. 13(9), pp. 1054–1056, 1980.

Kong et al., Temperature dependence of the current–voltage characteristics of metal–semiconductor field–effect transistors in n–type β–SiC grown via chemical vapor deposition, *Appl. Phys. Lett.*51(6), 10 (Aug. 1987).

Kelner et al., β–SiC MESFET's and Buried–Gate JFET's, *IEEE Electron Device Letters* vol. EDL–8, No. 9 (Sep. 1987).

Palmour et al., High–temperature depletion–mode metal–oxide–semiconductor field–effect transistors in beta–SiC thin films, *320 Applied Physics Letters*, 51 (Oct. 1987).

Dmitriev et al., High–temperature Sic–6H Field–effect Transistor with p–n gate, *Sov. Tech. Phys. Lett.*14(2) (Feb. 1988).

Edmond, J. A., et al.; *Electrical Contacts to Beta Silicon Carbide Thin Films, Journal of the Electrochemical Society* 135(2) (Feb. 1988).

Dimitriev et al., First SiC Dynistor, *Electronics Letters*, vol. 24, No. 16 (Aug. 1988).

Palmour et al., Characterization of device parameters in high–temperature metal–oxide–semiconductor/field–effect transistors in β–SiC thin films, *J. Appl. Phys.* 64(4) (Aug. 15, 1988).

Fuma et al., High Temperature Operated Enhancement––Type β–SiC MOSFET, *Japanese Journal of Applied Physics*, vol. 27, No. 11 (Nov. 1988).

Yoder et al., Silicon Carbide Comes of Age, *Naval Research Revies*(1989).

Kelner et al., High–Transconductance β–SiC Buried–Gate JFET's, *IEEE Transactions On Electron Devices*, vol. 36, No. 6 (Jun. 1989).

Palmour, et al., Ultrafast silicon carbide rectifiers, *Powertechnics Magazine*(Aug. 1989).

Pan et al., Reactive Ion Etching of SiC Thin Films By Mixtures of Flourinated Gases and Oxygen, *Journal of the Electrochemical Society*, 137, No. 1 (Jan. 1990).

Waldrop et al., Formation and Schottky barrier height of metal contacts to β–SiC, *Appl. Phys. Lett.*56(6) (Feb. 5, 1990).

Kanaya et al., Controlled sublination growth of single crystalline 4H–SiC and 6H–SiC and identification of polytypes by x–ray diffraction, *Appl. Phys. Lett.*, vol. 58, No. 1 (Jan. 7, 1991).

Kelner et al., High Temperature Operation of α–Silicon Carbide Buried–Gate Junction Field Effect Transistors, *Elec. Lett.*, vol. 27, No. 12 (Jun. 1991).

Edmond et al., Junction Devices in 6H–SiC, *International Semiconductor Device Research Symposium* (Dec. 4–6, 1991).

Baliga, New Materials Beyond Silicon For Power Devices, *Power Semiconductor Devices and Circuits* (1992).

Ivanov et al., Recent Developments in SiC Single–Crystal Electronics, *Semiconductor Science and Technology*, No. 7 (Jul. 1992).

Bhatnagar et al., SiC power UMOSFET: design, analysis and technological feasibility, *Inst. Phys. Conf.* No. 137, Ch. 7 (1993).

Alok et al., Low Contact Resistivity Ohmic Contacts to 6H–Silicon Carbide, *IEEE*(1993).

Bhatnagar et al., Comparison of 6H–SiC, and Si for Power Devices, *IEEE* (1993).

Slater, et al., NMOS and PMOS high temperature enhancement–mode and circuits in 6H–SiC, *Inst. Phys. Conf.*, No. 142, Ch. 4 (1996).

International Search Report.

* cited by examiner

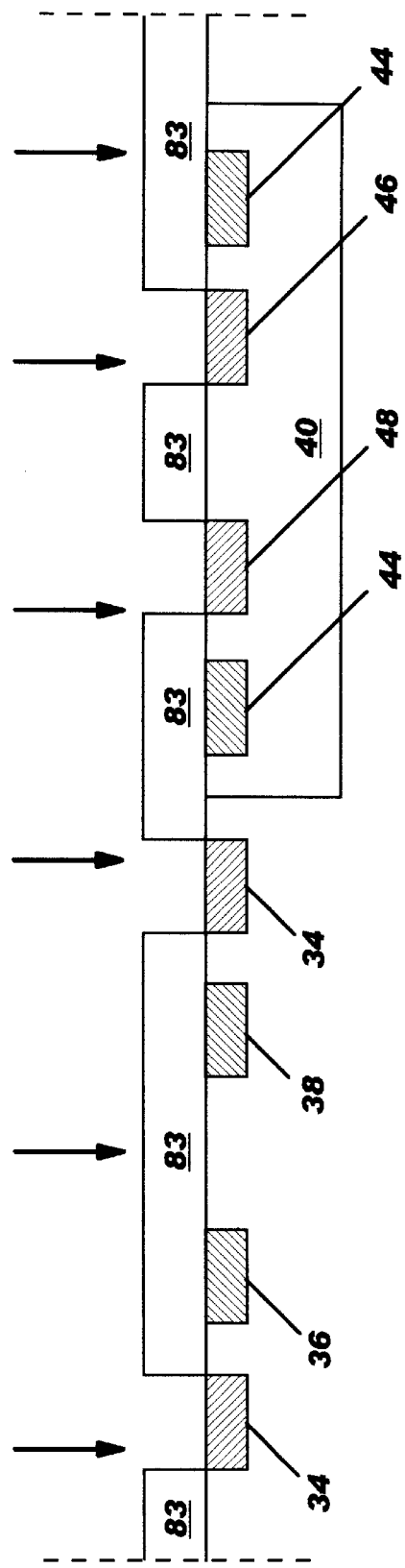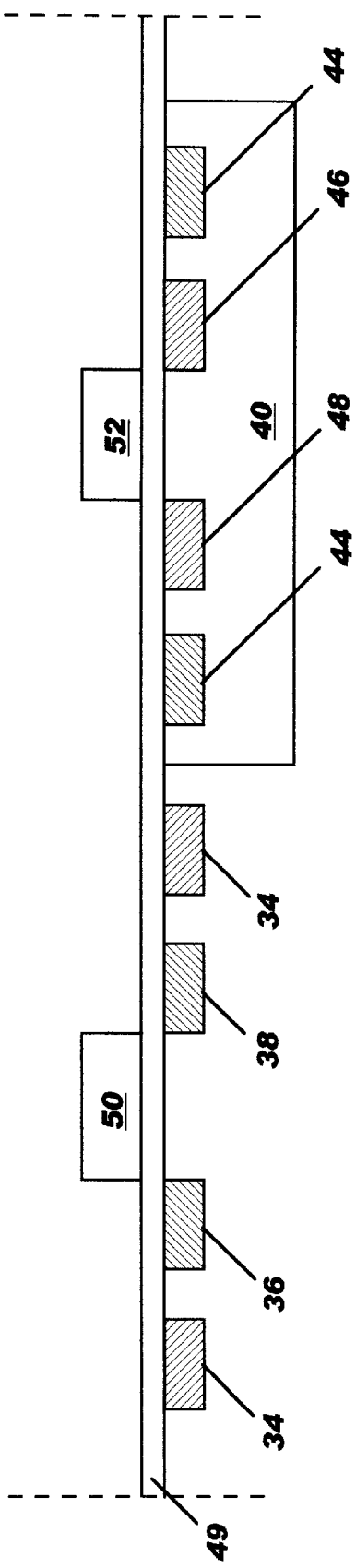

SILICON CARBIDE CMOS DEVICES

RELATED APPLICATIONS

This application is a continuation-in-part (CIP) of application Ser. No. 08/352,887, filed Dec. 9, 1994, now U.S. Pat. No. 5,629,531 which is a divisional of application Ser. No. 07/893,642, filed Jun. 5, 1992, now U.S. Pat. No. 5,459,107.

This invention was made with Government support and the Government has certain rights in this invention.

FIELD OF THE INVENTION

The present invention relates to metal/polysilicon-oxide semiconductor (MOS) devices formed in silicon carbide. More particularly the present invention related to complementary metal/polysilicon-oxide-semiconductor devices commonly known as CMOS formed in silicon carbide.

BACKGROUND OF THE INVENTION

Complimentary MOS (CMOS) integrated devices are monolithically integrated p-channel and n-channel transistors which are optionally interconnected in a single device. CMOS devices provide the basis for many integrated circuits such as operational amplifiers, sensing devices, digital logic, memory devices, and microprocessors. CMOS technology is readily adaptable to mixed analog and digital applications. The availability of active or current source loads makes it possible to generate large voltage gains with relatively small supply voltages and currents. CMOS also provides for low power digital circuits. CMOS is also attractive as a technology because lower power supply voltage operation and reduced circuit design complexity enhances reliability over all operating conditions.

To produce a CMOS device, a single substrate or die must be capable of producing transistors of complementary type. Thus, a single die must support both p-type and n-type regions to provide for the p-type and n-type channels of the complementary devices. Previous CMOS devices have been fabricated in silicon but have not been produced using silicon carbide. The difficulty in fabricating regions of opposite conductivity silicon carbide suitable for producing complementary transistors on a single die or wafer, in addition to the general difficulty in producing a p-channel silicon carbide MOS field effect transistor have prevented production of CMOS in silicon carbide.

Because of the advantages that CMOS integrated devices have over devices comprised solely of p-channel or n-channel transistors, it is desirable to overcome the barriers in silicon carbide to allow for the development of a CMOS silicon carbide integrated device technology.

OBJECT AND SUMMARY OF THE INVENTION

In view of the above, it is an object of the present invention to provide a method of fabrication of a monolithic silicon carbide integrated device with a p-channel transistor and an n-channel transistor on the same die or wafer. It is a further object of the present invention to provide a CMOS device formed in silicon carbide.

The methods and structures of the present invention provide an integrated device formed of silicon carbide. The integrated device has a first silicon carbide MOS field effect transistor formed in silicon carbide. This first MOS device has a channel region formed in p-type conductivity silicon carbide. Also in the integrated device is provided a second silicon carbide MOS field effect transistor formed in silicon carbide. This second MOS device has a channel region formed in n-type conductivity silicon carbide. Optionally, the drain of the first silicon carbide MOS field effect transistor is electrically connected to the drain of the second silicon carbide MOS field effect transistor.

In a preferred embodiment of the present invention the drain and source contacts of the first and second MOS field effect transistors are formed of the same material. The preferred material for these contacts is nickel.

Preferred structures provided by the present invention include structures for a complementary MOS integrated device which includes a layer of a first conductivity type silicon carbide which may be a substrate or an epitaxial layer. A well region of a second conductivity type silicon carbide is formed in the silicon carbide layer. A plurality of regions of the second conductivity type silicon carbide are formed in the silicon carbide layer to form a layer source region and a layer drain region in the silicon carbide layer. A plurality of regions of the first conductivity type silicon carbide are formed in the well region to form a well source region and a well drain region in the well region. A gate dielectric layer is formed between the layer source and the layer drain regions and extending over at least a portion of the layer drain and layer source regions. Likewise a gate dielectric layer is formed between the well source and the well drain regions and extending over at least a portion of the well source and well drain regions. A layer gate electrode is formed on the gate dielectric layer formed between the layer source region and the layer drain region so as to provide an active channel region in the first conductivity type silicon carbide layer between the layer source and the layer drain when a bias is applied to the layer gate electrode. A well gate electrode is also formed on the gate dielectric layer formed between the well source region and the well drain region so as to provide an active channel region in the second conductivity type well region between the well source and the well drain when a bias is applied to the well gate electrode.

A well source contact may also be formed on the well source region and a well drain contact may be formed on the well drain region. Similarly a layer source contact may be formed on the layer source region and a layer drain contact formed on the layer drain region.

In an alternate embodiment of the present invention, a plurality of well channel stop regions are formed in the well region. The stop regions are formed of the second conductivity type silicon carbide and have a higher carrier concentration than the well region. The channel stops are positioned such that the well source region and the well drain region are displaced between the channel stop regions. A plurality of layer stop regions may also be formed in the silicon carbide layer adjacent the layer source and the layer drain regions. The layer stop regions are formed of the first conductivity type silicon carbide and have a higher carrier concentration than the silicon carbide layer. The layer stop regions are formed such that the layer source and the layer drain regions are displaced between the layer stop regions.

In addition to the formation of the basic transistor devices, embodiments of the present invention may include an isolation layer formed on the silicon carbide layer, the well region, the well source, gate and drain contacts and the layer source, gate and drain contacts. This isolation layer allows for interconnections of the various silicon carbide devices. This interconnection may be achieved by a plurality of metallization regions for selectively providing connection to the well source, gate and drain contacts and the layer source, gate and drain contacts through connection windows formed in the isolation layer.

In a further embodiment of the present invention, a protective layer is formed on the exposed surfaces of the integrated device to protect the device from environmental damage. Connection pads may be formed in a connection pad window through the protective layer to allow for connection to any underlying region such as the interconnecting metallization.

In a further alternate embodiment of the present invention, at least one of the MOS devices has a source and drain layer region that is self-aligned to the gate electrode.

The method embodiments of the present invention include a method of forming a complementary MOS integrated device in silicon carbide. The method includes the steps of forming a first silicon carbide MOS field effect transistor in silicon carbide and having a channel region formed in p-type conductivity silicon carbide and forming a second silicon carbide MOS field effect transistor in silicon carbide which has a channel region formed in n-type conductivity silicon carbide.

In a particular embodiment of the methods of the present invention, the method of forming a silicon carbide integrated device includes the steps of forming a lightly doped silicon carbide layer of a first conductivity type having highly doped source and drain regions of a second conductivity type silicon carbide. The second conductivity type is an opposite conductivity type from the first conductivity type. A lightly doped well of the second conductivity type is formed in the lightly doped layer of the first conductivity type. The lightly doped well has formed in it highly doped source and drain regions of a first conductivity type silicon carbide. Gate dielectric layers are formed on the lightly doped silicon carbide layer between the source and drain regions of the lightly doped silicon carbide layer of the first conductivity type and on the lightly doped well of the second conductivity type between the source and drain regions in the lightly doped well.

In a preferred embodiment of the present invention, the lightly doped well is formed by creating a masking layer on a surface of the lightly doped silicon carbide layer so as to create a window corresponding to the region of the lightly doped well. Ions are implanted into the lightly doped silicon carbide layer through the window and the implanted well is annealed to activate the ions implanted in the lightly doped silicon carbide layer to create the lightly doped well of a second conductivity type. Preferably, the ions are implanted at a maximum implant energy of greater than about 250 keV.

In a preferred embodiment of the method of forming the drain and source regions, these regions are formed by creating a masking layer on a surface of the lightly doped silicon carbide layer so as to create a window corresponding to the regions of the highly doped source and drain regions of a second conductivity type. Ions are implanted into the lightly doped silicon carbide layer through the window and the implanted regions are annealed to activate the ions implanted in the lightly doped silicon carbide layer to create the highly doped source and drain regions of a second conductivity type. Preferably the highly doped source and drain regions of the first conductivity type are formed in the well region and activated in the same manner utilizing an appropriate mask and ion.

In a preferred embodiment of the methods of the present invention, the gate dielectric layers are formed by depositing a gate dielectric layer on the surface of the silicon carbide layer with exposed portions of the lightly doped well of a second conductivity type, the highly doped source and drain regions of a first conductivity type and the highly doped source and drain regions of a second conductivity type. The deposited dielectric layer is then heated in an oxidizing ambient.

In a further embodiment of the present invention, gate electrodes are formed on the gate dielectric layers, source contacts are formed on the source regions, and drain contacts are formed on the drain regions. The source contacts and the drain contacts are preferably formed by selective deposition of nickel. The gate electrodes are preferably formed by selective deposition of molybdenum. The formation of the source and drain contacts for both device types is preferably carried out simultaneously.

Stop regions may also be formed surrounding the channel regions and/or source and drain regions by adjusting the mask layer to allow ion implantation in locations surrounding the channel and/or source and drain regions of the device during implantation of the source and drain regions of the complementary device.

In an alternative preferred embodiment an interconnect isolation layer is formed over the gate, source and drain contacts and any exposed gate dielectric layer by deposition of an insulative material. Connections to source, drain and gate electrodes may be made by selectively opening vias in the interconnect isolation layer for contact to the underlying gate, source and drain contacts. A metallization layer may be selectively formed on the interconnect isolation layer to selectively connect the contacts or electrodes of the devices through the opened vias. Successive interconnect isolation layers with corresponding metallization layers and windows to underlying interconnection layers may be formed to provide a multi-layer interconnection system.

Contact pads may also be formed on the metallization to allow contact to probes or wire bonds. A contact pad may be formed by forming a platinum region on the metallization layer and forming a gold layer on the platinum region.

A protective layer may also be formed on the device to prevent environmental damage to the device. In such a case windows are opened in the protective layer to allow access to the contact pads.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DESCRIPTION OF THE DRAWINGS

FIG. 6 is a cross sectional view of an intermediate step in the fabrication of a CMOS integrated device according to the present invention;

FIG. 7 is a cross sectional view of an intermediate step in the fabrication of a CMOS integrated device according to the present invention;

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
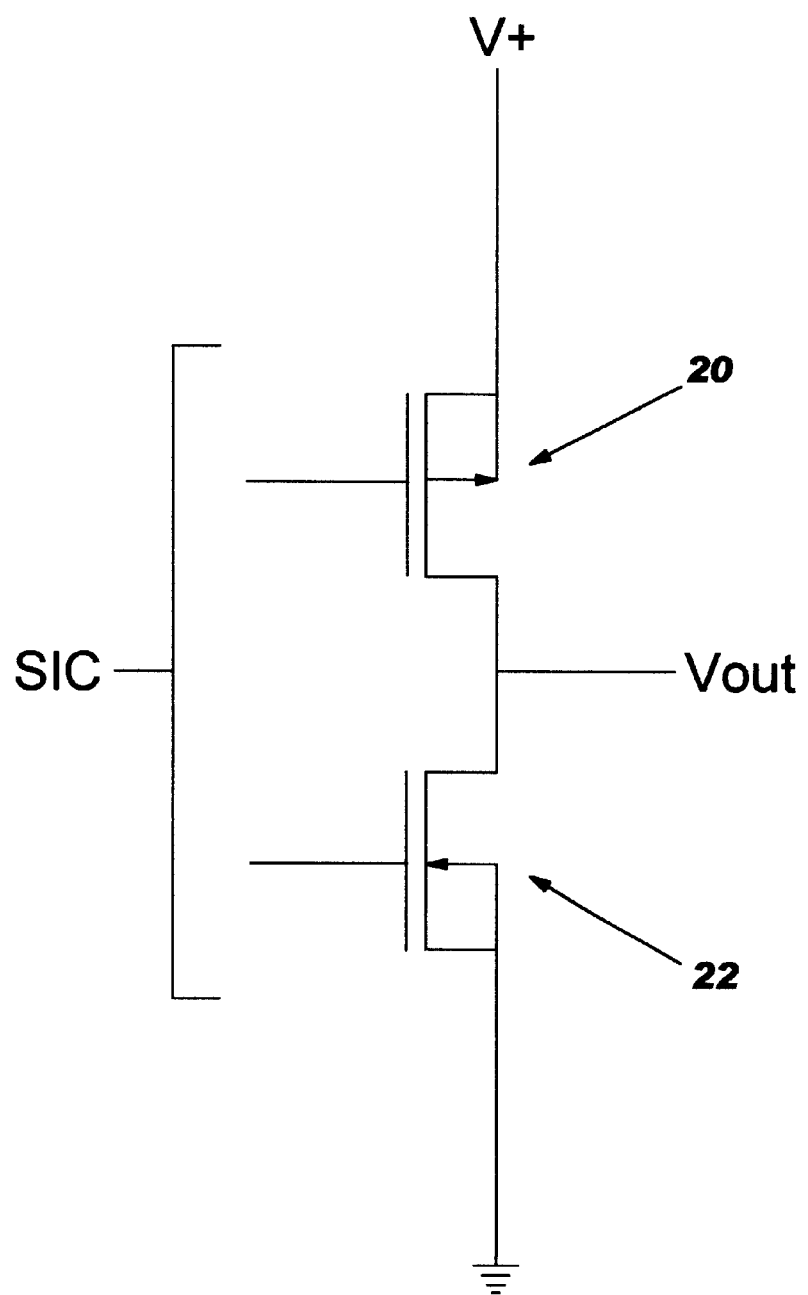
FIG. 1 is a circuit diagram of a CMOS integrated device according to the present invention.

FIG. 1 illustrates the basic circuit diagram of a CMOS device according to the present invention. As seen in FIG. 1, a p-channel MOSFET 20 and an n-channel MOSFET 22 are formed of silicon carbide. These transistors are formed in a single integrated device to create a CMOS integrated device. The transistors shown in FIG. 1 are illustrated with the source/drain region of one device connected to the source/drain region of the complementary device. These connections are optional as is the grounding of the source/drain of one transistor and the connection of the second transistor to a voltage source. By connecting the two gate inputs of the transistors it is possible to create a SIC CMOS invertor which is the basic building block of many CMOS digital circuits. The interconnection of the two transistors of FIG. 1 is shown for illustration purposes only.

Figure 2:
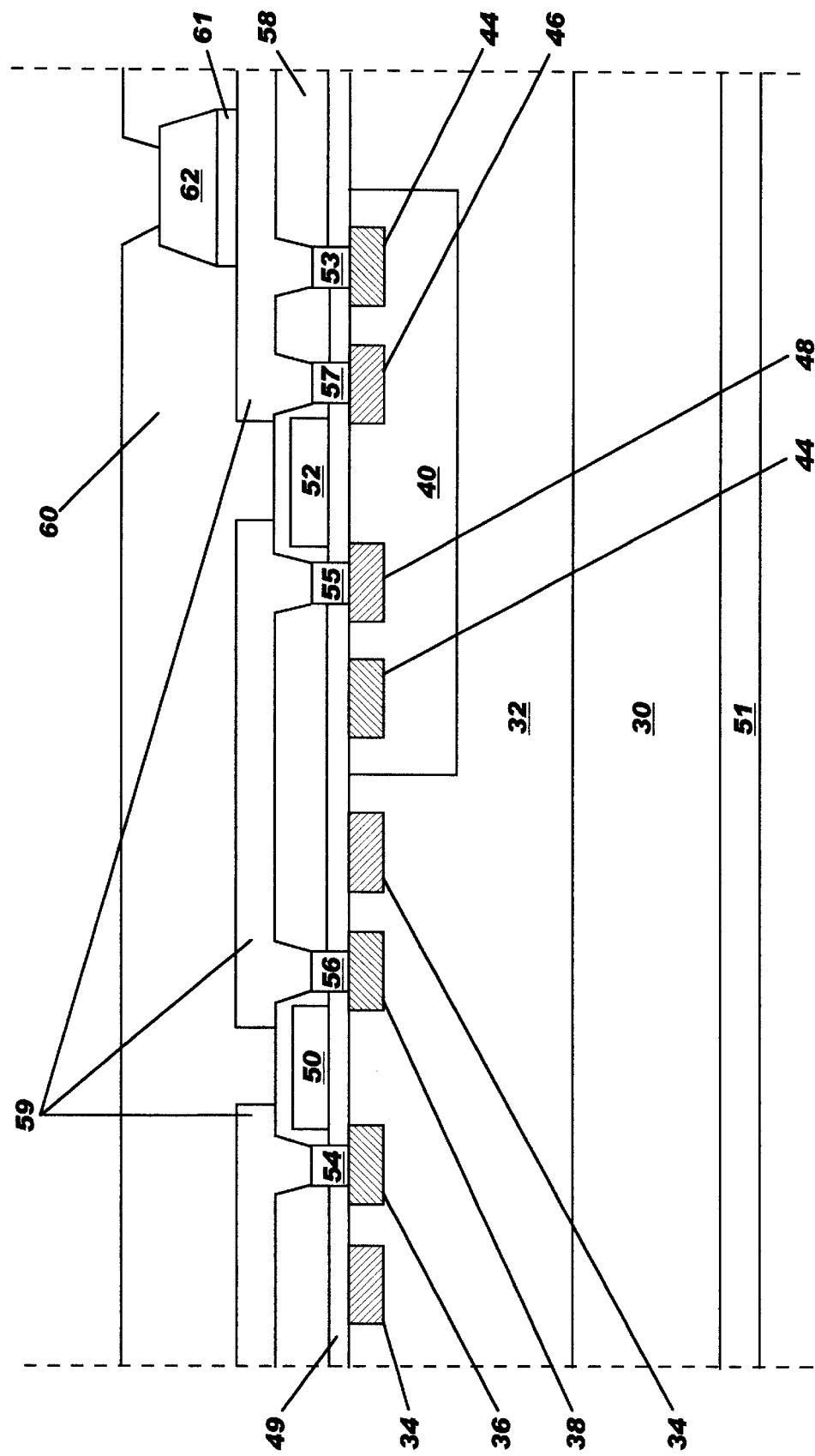
FIG. 2 is a cross-sectional view of a CMOS integrated device according to the present invention.

The complementary transistors of FIG. 1 will now be described with reference to FIG. 2 which illustrates one possible cross section for a CMOS silicon carbide integrated device according to the present invention. As shown in FIG. 2, a bulk single crystal silicon carbide substrate 30 of a first conductivity type has a lightly doped epitaxial layer 32 of the first conductivity type formed on its upper surface. For purposes of illustration, the first conductivity type may be p-type conductivity silicon carbide, thus making the epitaxial layer 32 lightly doped p-type (p⁻) conductivity silicon carbide.

Formed in the epitaxial layer 32 is a well region 40 of a second conductivity type silicon carbide. For purposes of illustration, the second conductivity type may be n-type conductivity silicon carbide, thus making the well region 40 lightly doped n-type (n⁻)conductivity silicon carbide.

A plurality of regions of the second conductivity type silicon carbide are formed in the silicon carbide epitaxial layer 32 to form a layer source region 36 and a layer drain region 38. These source and drain regions are highly doped regions such that, in the present example, they would be n⁺ silicon carbide. A plurality of highly doped second conductivity type silicon carbide regions 44 are also formed in the well region 40 to create well stop regions. These regions in the present example would also be n⁺ silicon carbide. Preferably, the channel stop regions define the perimeter of the device, however, the channel stop regions may only be formed to confine the channel region of the device. Thus, for example, as seen in FIG. 2, the channel stop regions may be formed only in a third dimension to the cross section show in FIG. 2 such that the channel stop regions run perpendicular to the source and drain regions to confine the channel to the regions between the source and drain regions.

A plurality of regions of the first conductivity type silicon carbide are formed in the well region 40 to form a well source region 46 and a well drain region 48. These source and drain regions are highly doped regions such that, in the present example, they would be p⁺ silicon carbide. The well source region 46 and well drain region 48 are formed within the confines of the well channel stop regions 44. Preferably, the channel stop regions define the perimeter of the device, however, the channel stop regions may only be formed to confine the channel region of the device. Thus, for example, as seen in FIG. 2, the channel stop regions may be formed only in a third dimension to the cross section show in FIG. 2 such that the channel stop regions run perpendicular to the source and drain regions to confine the channel to the regions between the source and drain regions. A plurality of highly doped first conductivity type silicon carbide regions 34 are also formed in the silicon carbide epitaxial layer 32 to create layer stop regions. These regions in the present example would also be p⁺ silicon carbide. As seen in FIG. 2, the layer stop regions 34 are formed outside the layer source region 36 and layer drain region 38.

The use herein of the terms "layer" and "well" as prefixes to a feature serves to distinguish the features of one transistor from the other, complementary, transistor. For example, a well source region would refer to a region which is associated with the transistor formed in the second conductivity type silicon carbide well. A layer source region refers to a region which is formed in the first conductivity type silicon carbide layer.

Furthermore, while the present invention uses the term "well" to describe the region where the complementary device is formed, as will be appreciated by those of skill in the art, any shaped region of opposite conductivity type silicon carbide may be utilized as long as it is capable of having a complementary silicon carbide device formed in the region. Thus, for example, the "well" region 40 may extend completely through the epitaxial layer 32 to substrate 30 so as to form a contiguous region of second conductivity type silicon carbide which interrupts epitaxial layer 32. Accordingly, the use of the term "well" is used to describe a region where a complementary device may be formed, however that region is created.

Also shown in FIG. 2 is a gate dielectric layer 49 which is formed on the surface of the epitaxial layer 32 opposite the substrate 30. The gate dielectric layer 49 is illustrated as being formed over the entire upper surface of the epitaxial layer 32 with windows opened in the gate dielectric layer 49 over the source and drain regions 36, 38, 46, and 48. However, the gate dielectric layer 49 need only be formed on the epitaxial layer 32 between layer source region 36 and layer drain region 38 and well source region 46 and well drain region 48 with a suitable overlap of the source and drain regions.

As is further illustrated in FIG. 2, a layer gate electrode 50 is formed on the gate dielectric layer 49 between the layer source region 36 and layer drain region 38. The layer gate electrode 50 provides an active channel region in the first conductivity type silicon carbide layer between the layer source and the layer drain when a bias is applied to the layer gate electrode Likewise, a well gate electrode 52 is formed on the gate dielectric layer 49 between well source region 46 and well drain region 48. The well gate electrode 52 provides an active channel region in the second conductivity type well region between the well source and the well drain when a bias is applied to the well gate electrode. While various materials such as poly-silicon may be utilized for forming the gate electrodes, molybdenum is preferred.

FIG. 2 further illustrates a layer source ohmic contact 54, a layer drain ohmic contact 56, a well source ohmic contact 57 and a well drain ohmic contact 55 formed on their respective source and drain regions. A well body contact 53 is also shown in FIG. 2. These ohmic contacts are preferably formed of the same material and more preferably formed of nickel. However, as will be appreciated by one of skill in the art, ohmic contacts formed on the various conductivity type silicon carbide regions may be formed of different contact materials. Accordingly, nickel may be used to form ohmic contacts to n-type silicon carbide regions and aluminum and/or titanium or platinum may be utilized to form ohmic contacts to p-type silicon carbide regions. Differing contact materials, however, are not preferred because of the increased complexity of fabrication.

Also shown is an ohmic contact 51 formed on the surface of substrate 30 opposite epitaxial layer 32. This layer serves as the layer body contact of the layer device and may be formed of any suitable material for forming an ohmic contact with silicon carbide. In the present example, platinum would be suitable for forming the ohmic contact to the p-type substrate. Optionally, the layer body contact may be formed by contacting the epitaxial layer 32 directly.

An interconnect isolation layer 58 is also illustrated in FIG. 2 and may optionally be formed on the exposed surfaces of the integrated device. This isolation layer 58 is formed on the silicon carbide layer 32 to isolate the well region 40, the layer source contact, gate electrode and drain contact 54, 50 and 56 and the well source contact, gate electrode, drain and body contacts 57, 52, 55 and 53. A plurality of metallization regions 59 may also be provided for selective interconnection of the layer source contact, gate electrode and drain contact 54, 50 and 56 and the well source contact, gate electrode and drain and body contacts 57, 52, 55 and 53 through connection windows formed in the isolation layer 58. As shown in FIG. 2, the drains of the two complementary transistors are connected through a metallization region, however, such is not required by the present invention. Metallization formed of molybdenum is preferred for the present invention, however, other materials such as aluminum may be utilized.

A protective layer 60 may also be formed on the exposed surfaces of the integrated device, such as the metallization regions 59 and the isolation layer 58, to protect the device from environmental damage. Connection pads may also be formed in a connection pad window through the protective layer 60 where the connection pad is selectively formed on the underlying regions such as the metallization regions to provide external contact to the underlying regions. A connection pad is shown in FIG. 2 as a layer of platinum 61 formed on the metallization region 59 in a connection pad window and a layer of gold 62 formed on the layer of platinum 61.

In addition to the general structure above, it is preferred that the gate overlap of the source and drain regions of the both device types be made as small as possible while still allowing for formation of a channel region between the source and the drain when a bias is applied to the gate electrode. Furthermore, the devices may have self aligned gates for one or both of the devices. Methods of self aligning gates in 3C silicon carbide have been discussed in Palmour et al., *J. App. Phys.*, 64, p. 2168 et seq. (1988) which is incorporated herein by reference as if set forth fully.

While the present invention is described above with respect to the formation of the complementary devices in an epitaxial layer formed on a silicon carbide substrate, the present invention is not limited to such a device. For example, the complementary devices may be formed in a silicon carbide substrate with no epitaxial layer. Additionally, there may be additional layers interspersed between a substrate and the silicon carbide layer in which the complementary devices are formed. Accordingly, as used herein the term silicon carbide layer may refer to a layer of silicon carbide formed on a substrate, to a layer of silicon carbide formed on another layer or to a silicon carbide substrate.

Also, the above device has been discussed with reference to a p-type epitaxial layer and an n-type well region, a device having an n-type epitaxial layer and a p-type well region may also be utilized. In such a case the first conductivity type silicon carbide would be n-type silicon carbide and the second conductivity type silicon carbide would be p-type silicon carbide. Alternatively, an epitaxial layer of opposite conductivity to a substrate could be used where devices of one channel type are formed in the epitaxial layer and complementary devices formed in the substrate.

The method of fabrication of devices according to the present invention will now be described with reference to FIGS. 3 through 9. Fabrication of CMOS in silicon carbide may be accomplished through a nine step process which includes ion implantation of the source and drain regions of both device types and the well region for the complementary device. Suitable methods for ion implantation acording to the present invention include the high temperature ion implantation methods of commonly assigned U.S. Pat. No. 5,087,576, the disclosure of which is incorporated herein as if set forth fully. These fabrication steps will now be described with reference to fabrication of a silicon carbide device on a p-type epitaxial layer formed on a p-type silicon carbide substrate. However, as described above, the present invention is not limited to devices utilizing a p-type silicon carbide layer but may also be used with n-type silicon carbide layers with suitable substitutions of implantation ions and fabrication techniques based upon the changes in conductivity type. For example, a p-type well region for fabrication of the complementary device could be formed in an n-type silicon carbide layer through implantation of boron ions in the n-type silicon carbide layer.

Figure 3:
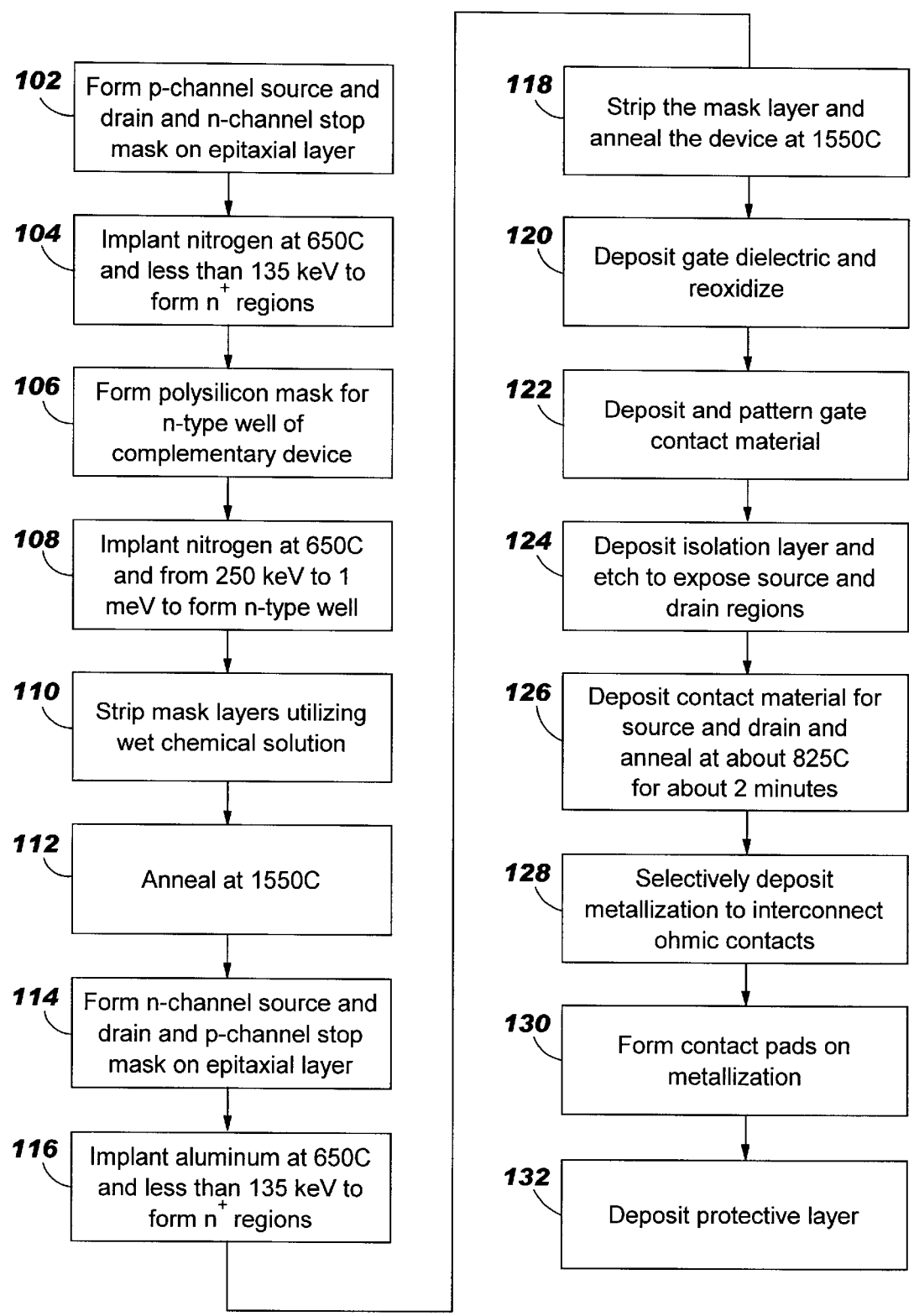
FIG. 3 is a flow diagram describing the fabrication sequence for a CMOS device such as that shown in FIG. 1.
Figure 4:
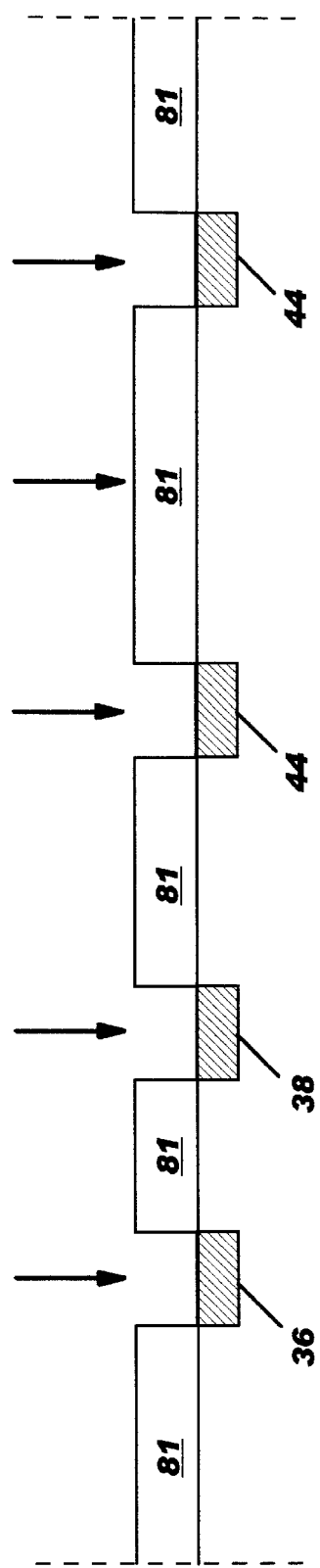
FIG. 4 is a cross sectional view of an intermediate step in the fabrication of a CMOS integrated device according to the present invention.

FIG. 4 illustrates the beginning steps of forming a CMOS integrated device in silicon carbide. After growth of an epitaxial layer on a lightly doped p-type silicon carbide substrate, a mask layer 81 is formed to expose the layer source and drain regions and the well channel stops. The formation of the mask layer is illustrated as block 102 of FIG. 3. 6H silicon carbide is the preferred polytype for the present invention, however, other silicon carbide poly-types, such as 3C, 4H, and 12H may also be utilized. Preferred carrier concentrations for the p-type substrate range from about $1\times10^{16}$ to about $1\times10^{18}$ cm$^{-3}$, however, the doping level of the substrate as it is used in the present example is not critical. Preferred carrier concentrations for the p-type epitaxial layer range from about $1\times10^{15}$ to about $1\times10^{17}$ cm$^{-3}$. The mask layer may be formed of silicon dioxide (SiO$_2$), however, any suitable masking material may be utilized.

The masked wafer is implanted with nitrogen ions to form the n$^+$ source and drain regions for the n-channel device and the n$^+$ well channel stops for the p-channel device. The implantation step is reflected in block 104 of FIG. 3. While nitrogen is the preferred ion for implantation to form the n$^+$ regions, other suitable ions known to those of skill may also be utilized. The nitrogen is preferably implanted at a temperature of 650° C., however, implantation temperatures ranging from about room temperature to about 1300° C. maybe utilized. The nitrogen is also preferably implanted with multiple implant energies of not greater than 135 keV with maximum implant energies of less than about 200 keV being suitable. Suitable carrier concentrations for the n$^+$ implanted regions are from about 1×10$^{17}$ to about 1×10$^{20}$ cm$^{-3}$.

Figure 5:
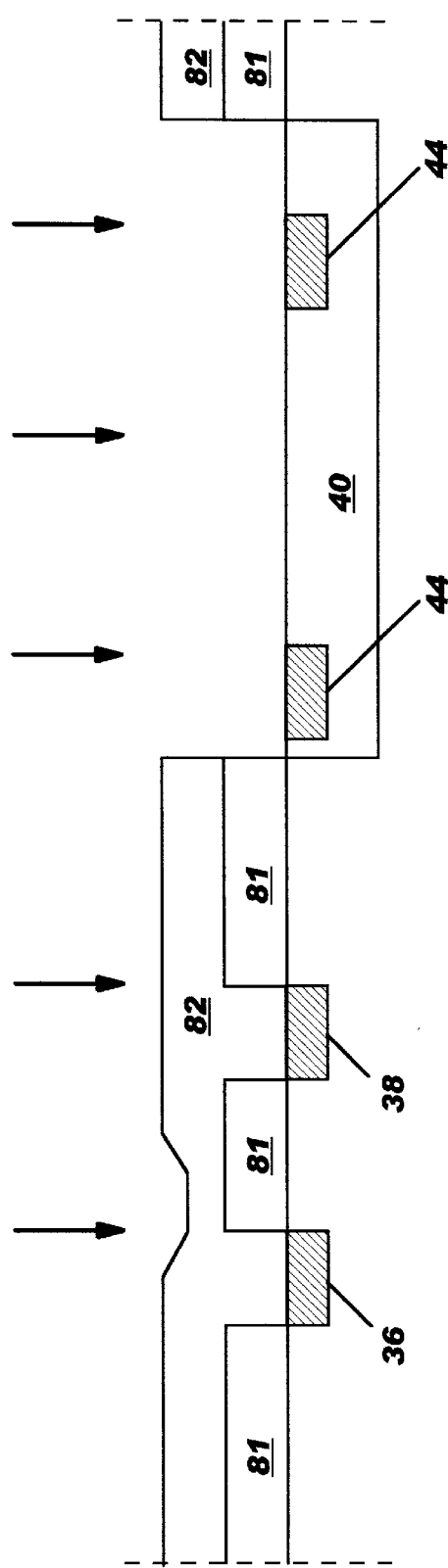
FIG. 5 is a cross sectional view of an intermediate step in the fabrication of a CMOS integrated device according to the present invention.

FIG. 5 illustrates that after implantation of the n$^+$ regions the wafer is recoated with polysilicon 82 which is patterned to form an opening in the polysilicon and the underlying oxide mask. The formation of the polysilicon mask is shown in block 106 of FIG. 3 This opening corresponds to the n-type well which provides the opposite conductivity region for the n-channel device. After formation and patterning of the polysilicon/oxide mask, nitrogen is again implanted in the p-type epitaxial layer to form the n$^-$ well region 40. Implantation of the well region is illustrated in block 108 of FIG. 3. Nitrogen is the preferred ion for implantation to form the n$^-$ well region. The nitrogen is preferably implanted at a temperature of 650°C., however, implantation temperatures ranging from about room temperature to about 1300° C. maybe utilized. The nitrogen is also preferably implanted multiple implant energies with a maximum implant energy of about 380 keV. However, maximum implant energies ranging from about 250 keV to about 1 MeV may be suitable. Suitable carrier concentrations for the n$^-$ well region is from about 1×10$^{15}$ to about 1×10$^{17}$ cm$^{-3}$. Because of the difficulty of implanting deep wells in silicon carbide and the need to support an application dependent reverse bias voltage, the implant profile of the well region may be tailored such that impurity concentration increases with depth.

After implantation of the n-type well, the wafers are stripped of the mask layers utilizing a wet chemical solution such as hydrofluoric acid or other suitable solutions. The stripping operation is illustrated in block 110 of FIG. 3. After stripping, the wafers are annealed to remove damage from caused by ion implantation and to activate the implanted dopants. The wafer is preferably annealed at 1550° C., however, temperatures ranging from 1000 to about 1800° C. are suitable. The annealing step is shown in block 112 of FIG. 3. Optionally, the wafer may be annealed after multiple ion implantations are performed.

After annealing, a third mask layer 83 is formed on the epitaxial layer to create the n-channel stop regions 34 and the p-channel source 46 and drain 48 regions. This mask layer is illustrated in FIG. 6. As with the first masking operation, silicon dioxide or any other suitable masking material may be utilized for the mask layer. The formation of the third mask layer is illustrated in FIG. 3 at block 114. Aluminum is then implanted to form the p$^+$ well source and drain regions 46 and 48 and to form the layer stop regions 34. The implantation step is reflected in block 116 of FIG. 3. While aluminum is the preferred ion for implantation to form the p$^+$ regions, another suitable ion includes boron. The aluminum is preferably implanted at a temperature of about 1200° C., however, implantation temperatures ranging up to about 1300° C. maybe utilized. The aluminum is also preferably implanted with multiple implant energies of up to about 135 kev with a maximum implant energy being dependent on the depth of the well region. The source and drain region maximum implant energy is limited such that when the source and drain are reverse biased with respect to the well region, the well region beneath the source and drain is not fully depleted and the depletion region below the source and drain does not extend into the substrate. Suitable carrier concentrations for the p$^+$ implanted regions are from about 1×10$^{17}$ to about 1×10$^{20}$ cm$^{-3}$.

After implantation of the p$^+$ regions, the third mask is stripped as described above and the wafer is again annealed as described above. This second strip and anneal step is illustrated in block 118 of FIG. 3. After the second anneal, the wafers may optionally be thermally oxidized to remove surface damage and the resulting oxide again stripped.

After the formation of the n$^+$ and p$^+$ regions, the two devices are fabricated in the same manner. As seen in FIG. 7, the gate dielectric layer 49 is deposited on the epitaxial layer 32 so as to cover the channel regions of the two devices. This gate dielectric layer is preferably silicon dioxide and is deposited and then oxidized as described in commonly assigned U.S. Pat. No. 5,459,107 entitled METHOD OF OBTAINING HIGH QUALITY SILICON DIOXIDE PASSIVATION ON SILICON CARBIDE AND RESULTING PASSIVATED STRUCTURES, and as described in copending and commonly assigned U.S. patent application Ser. No. 08/554,319, entitled PROCESS FOR REDUCING DEFECTS IN OXIDE LAYERS ON SILICON CARBIDE, filed Nov. 8, 1995, the disclosures of which are incorporated herein by reference as if set forth fully. Thus, after deposition of a silicon dioxide layer, the wafers are preferably placed in a furnace in an oxidizing ambient for several hours prior to the deposition of gate metal on the gate dielectric 49. This deposit and re-oxidize step is illustrated in block 120 of FIG. 3.

While deposition and reoxidation of the gate dielectric layer is preferred, other methods of forming the gate dielectric layer, such as thermally growth may be utilized. The densified deposited oxide was chosen as the gate insulator to strengthen the gate overlap regions of the device where most MOSFET oxide reliability failures occur. The deposited oxide eliminates the step that develops at either end of the lightly doped channel during the growth of a thermal gate oxide. This step is the result of an enhanced oxidation rate over the implanted source/drain regions. The step can act as a field concentrator in the gate overlap regions and stress the gate oxide. The dielectric strength of an oxide which is grown on heavily implanted SiC is poor, and additional stress increases the likelihood of an oxide related failure in the overlap region. This weakness may be attributed to impurity incorporation, non-stoichiometric growth, or a rough SiC—SiO$_2$ interface due to impurity segregation or implant damage. A deposited oxide reduces these concerns related to impurity incorporation and segregation. The incorporation of aluminum in the gate overlap regions of p-channel devices is a particular problem because it creates a deleterious gate leakage path at elevated temperatures. The oxidizing anneal step is performed to ensure proper oxide stoichiometry and to improve the SiC—SiO$_2$ interface.

After completion of the formation of the gate dielectric layer 49, the gate metal, 50 and 52, is deposited and patterned. This operation is shown in block 122 of FIG. 3. As discussed above, the gate material is preferably molybdenum, however, other suitable gate materials include polysilicon or aluminum.

Figure 8:
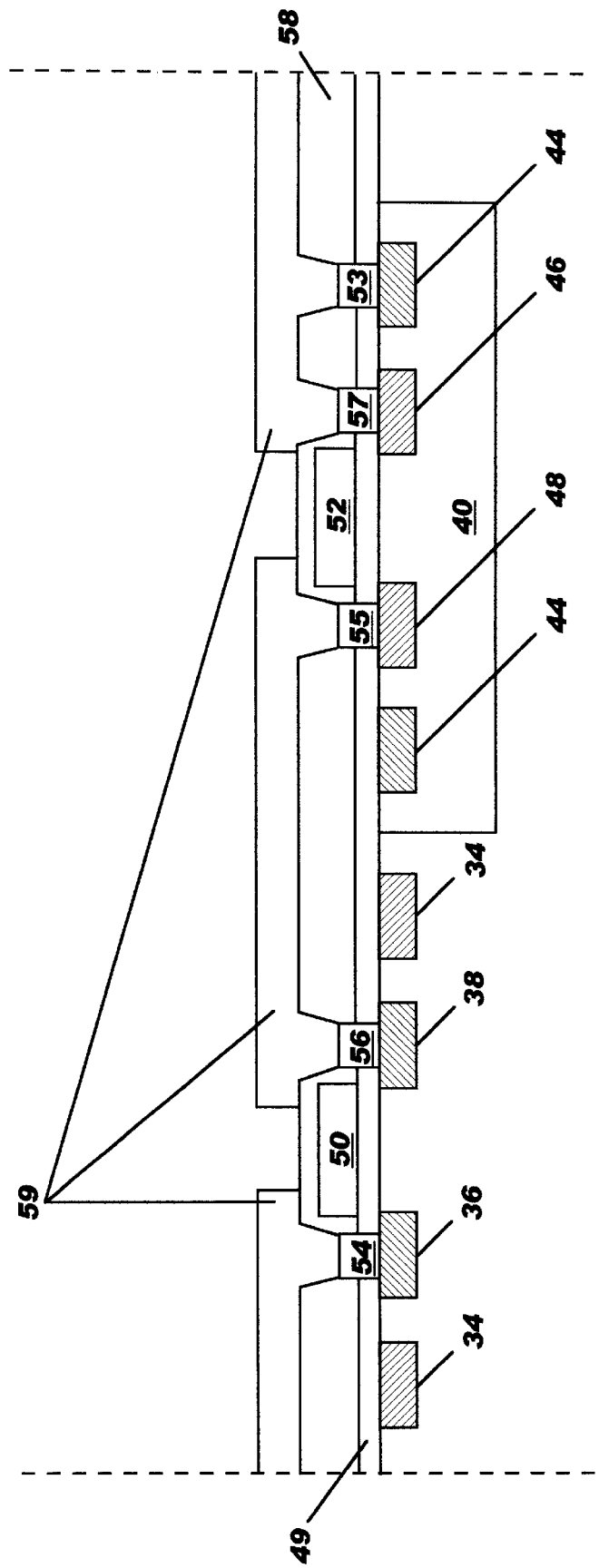
FIG. 8 is a cross sectional view of an intermediate step in the fabrication of a CMOS integrated device according to the present invention.

After deposition of the gate material, an isolation layer 58 is deposited on the wafer and vias are etched through the isolation layer to expose portions of the n+ and p+ source and drain regions or the well region or the epitaxial layer. The formation of the isolation layer 58 is illustrated in FIG. 8. The isolation layer 58 is preferably formed of silicon dioxide but may be formed of any suitable insulating material such as silicon nitride. The isolation layer serves to isolate the devices from an interconnect metallization layer which is formed on the isolation layer. The formation of the isolation layer is reflected in block 124 of FIG. 3.

After formation and etching of the isolation layer 58, nickel or other suitable ohmic contact material is deposited in the vias opened in the isolation layer 58 to simultaneously create the source and drain ohmic contacts 54, 56, 55 and 57 and the well region contact 53. While the simultaneous creation of contacts for both type devices is preferred, the p-type contacts and the n-type contacts could be formed of differing materials and formed in multiple fabrication steps if desired. The contacts are preferably annealed for about 2 minutes at about 825° C., however, any time and temperature combination sufficient to form the metal-semiconductor contact may be utilized. The contact formation steps are illustrated in block 126 of FIG. 3.

After formation of the contacts, metallization 59 is selectively formed on the isolation layer to selectively connect the devices sources, drains, gates and epitaxial layer or well region. As an example, the drains of the two devices illustrated in FIG. 8 are interconnected by metallization formed on the isolation layer. The metallization is preferably formed of molybdenum, however, other suitable metallization materials such as aluminum may be utilized. The formation and patterning of the interconnection metallization may be done by any suitable technique known to those of skill in the art. The formation of the interconnect metallization is shown in block 128 of FIG. 3.

Figure 9:
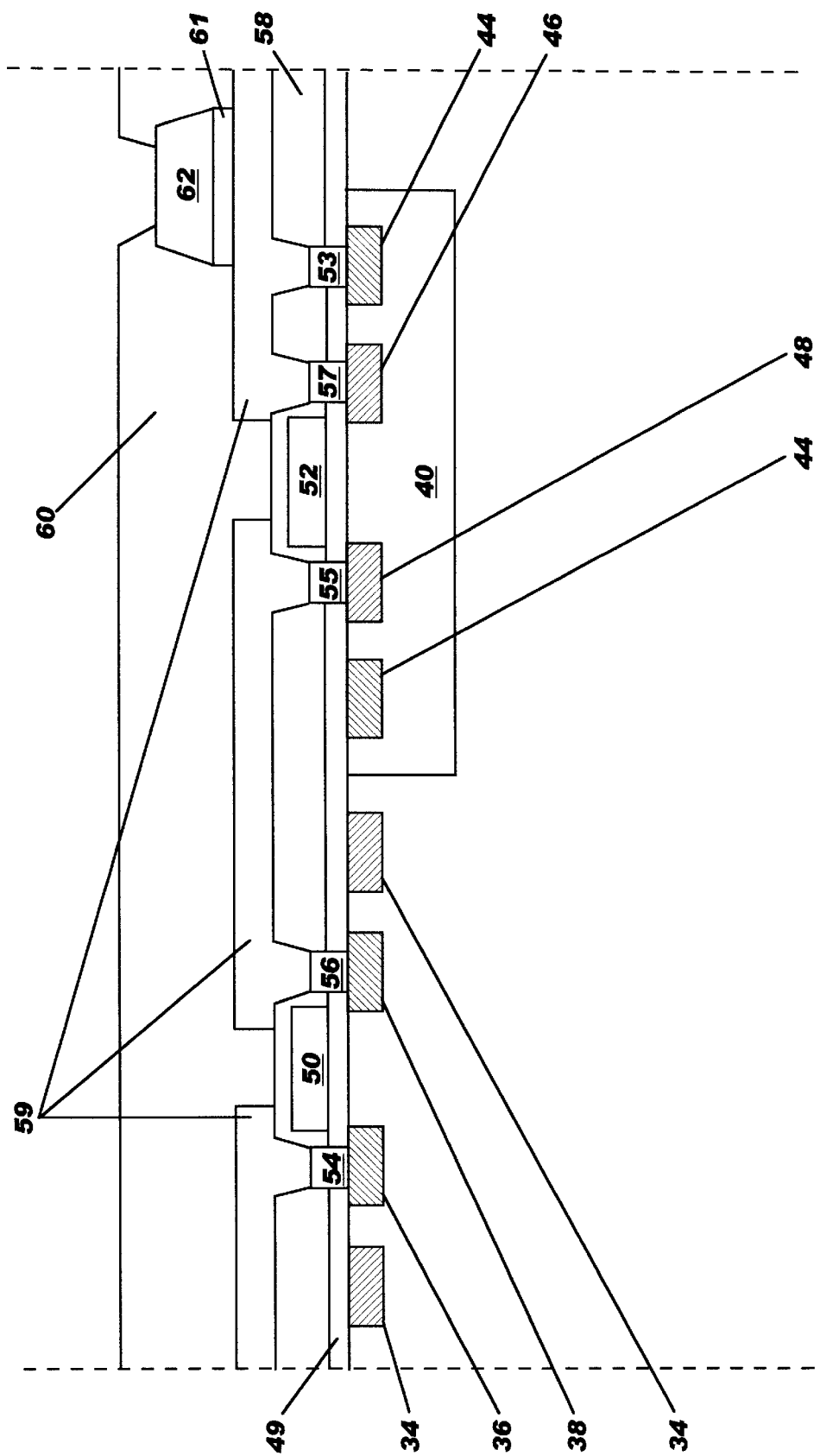
FIG. 9 is a cross sectional view of an intermediate step in the fabrication of a CMOS integrated device according to the present invention.

An example of the final device is shown in FIG. 9. The final steps of fabrication of the device include selectively forming contact pads by depositing a platinum layer 61 and a gold layer 62 on the metallization layer 59. The formation of the contact pads is shown in block 130 of FIG. 3 The entire device is then covered with a protective layer 60 to protect the device from the environment. The protective layer 60 is patterned to open vias above the contact pads to allow for probing or formation of wire bond or other suitable external connections. The protective layer 60 may be a deposited layer of silicon dioxide or other suitable material such as silicon nitride. The formation of the protective layer is illustrated in block 132 of FIG. 3.

Described above have been various formation and patterning steps for the creation of masking or isolation or protective layers. These steps may be carried out using any suitable technique for formation and patterning such as, for example, by chemical vapor deposition or other techniques known to those of skill in the art. Suitable equipment for the formation of the devices utilizing the growth, deposition and implantation techniques described above is commercially available and known to those of skill in the art.

Figure 10:
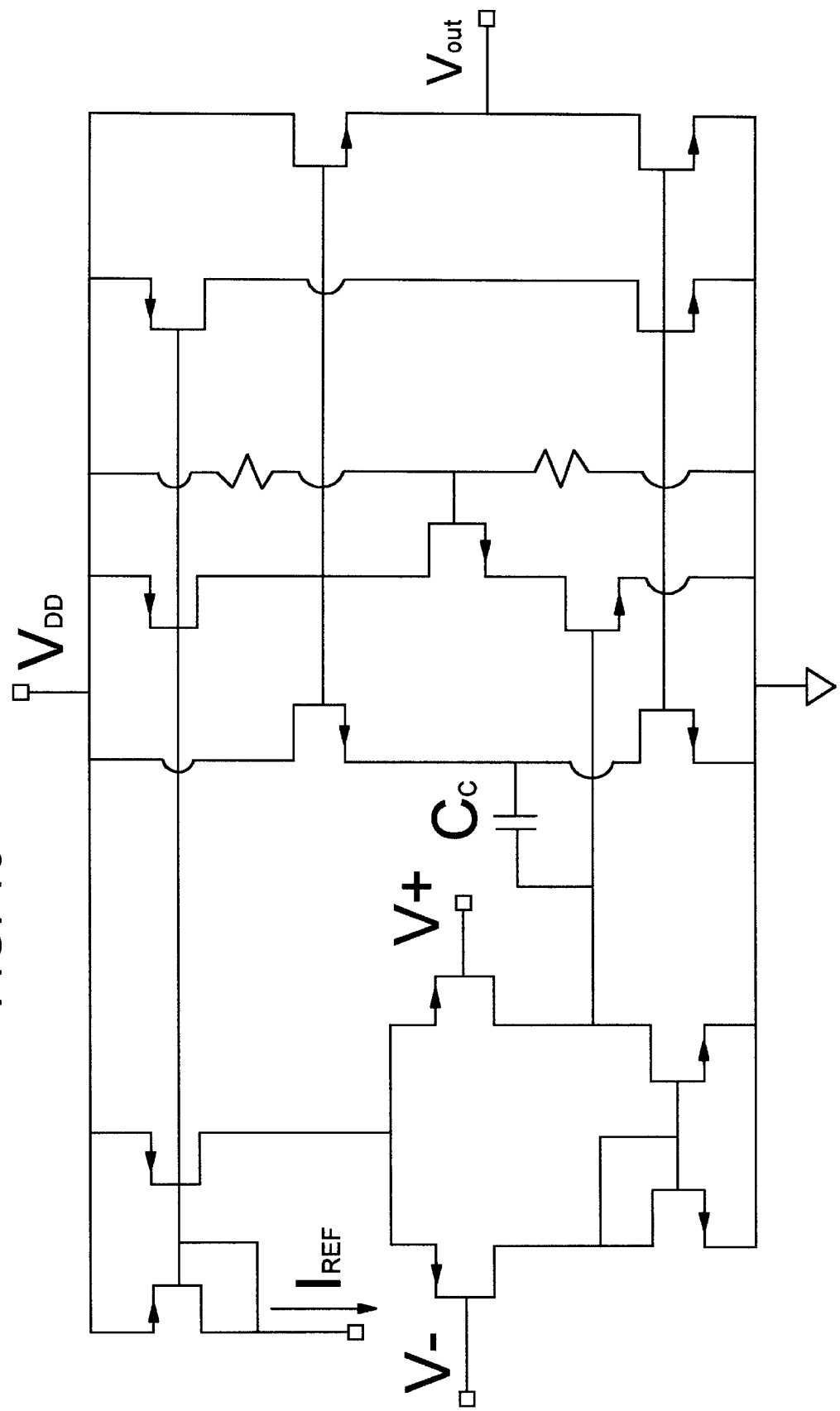
FIG. 10 is a circuit diagram of a silicon carbide operational amplifier utilizing the present invention.

A CMOS silicon carbide integrated circuit has been fabricated utilizing the present invention. The CMOS silicon carbide circuit is illustrated in FIG. 10 and is an operational amplifier. The operational amplifier was formed on a 6H p-type silicon carbide substrate with a p-type epitaxial layer doped to a carrier concentration of from about $2\times10^{15}$ cm$^{-3}$ to about $2\times10^{16}$ cm$^{-3}$. The epitaxial layer had a thickness of about 3 to 5 µm. The fabrication techniques described above were carried out to create the complementary devices required for the operational amplifier of FIG. 10.

The n-well for the p-channel device was created with a 15 V power supply in mind. The high temperature nitrogen implant energy was limited at the time to 380 keV. The worst case condition is having the drain of a p-channel device near ground (the substrate potential) while the n-well is at VDD which puts 15 V of reverse bias on the well from both directions. To support this bias without punching through the n-wall, the simulated profile shown in FIG. 13 was implemented. A higher implant energy and lower dose may also be utilized to form a deeper and flatter impurity profile which may accomplish the same reverse bias capability. The reverse bias capability may also be reduced to accommodate a $V_{DD}$ of 12 V, another common supply voltage available in most systems. This would reduce the total dose and energy required to form the n-wells, and would reduce implant damage that occurs in forming the n-well. The dual use of the source/drain implants for channel stops was employed here to simplify this process, however, separate implants with lighter doses and lower energies may also be utilized.

Figure 13:
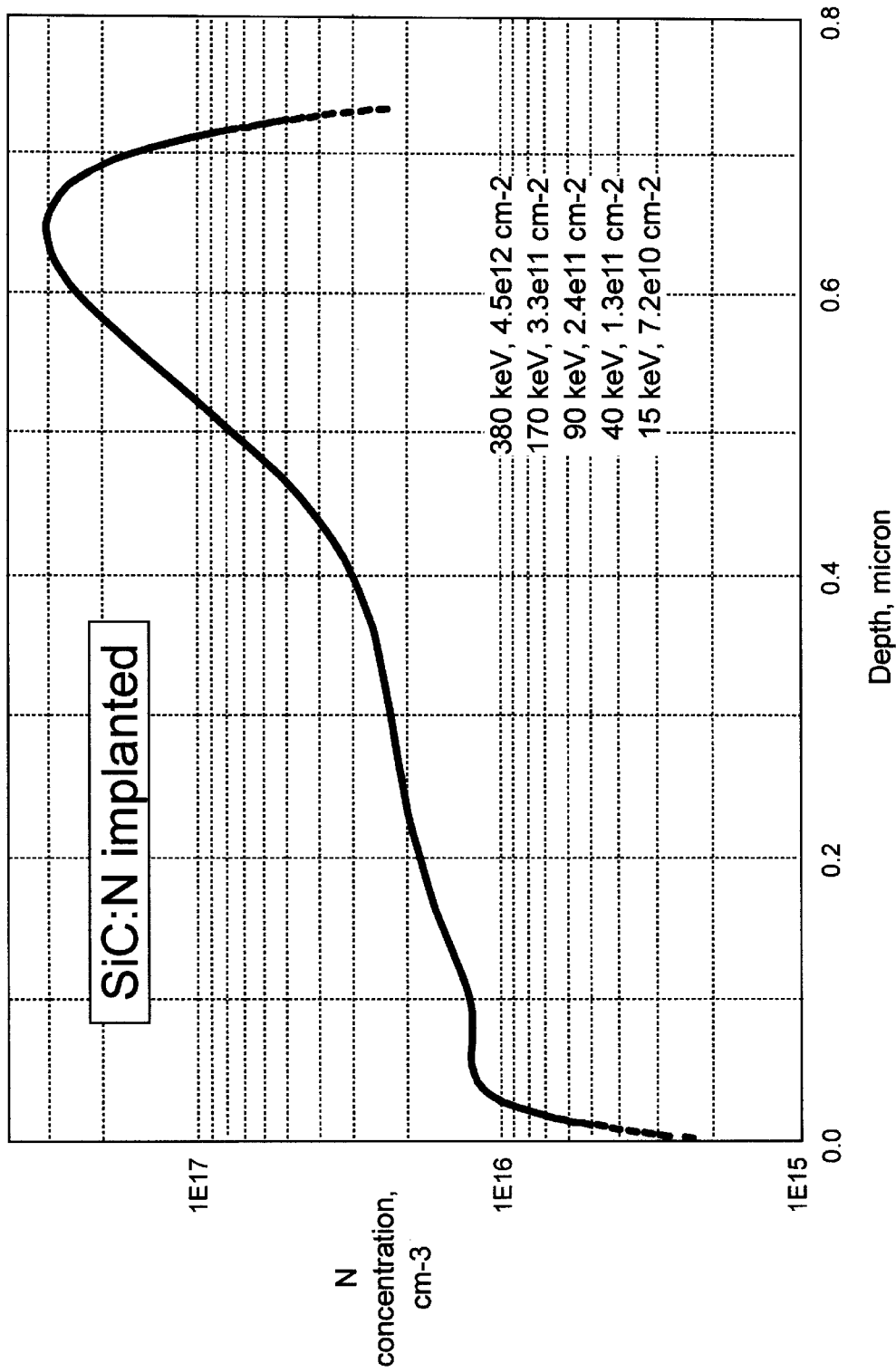
FIG. 13 is a plot of the implant profile of an example of an n-type well according to the present invention.

The carrier concentrations of the n+ regions of the device were approximately $1\times10^{19}$ cm$^{-3}$ and carrier concentrations of the n− well are illustrated in FIG. 13. The carrier concentration of the p+ regions was approximately $1\times10^{18}$ cm$^{-3}$. The n+ and p+ regions were implanted to a depth of about 0.35 and 0.25 µm respectively and the source and drain regions had dimensions of about 8 µm by 25 µm to about 100 µm. The n-type wells were formed to a depth of approximately 0.7 µm in the p-type epitaxial layer. Gate widths of approximately 25 to 200 µm and gate lengths of approximately 2 to 8 µm were utilized.

Figure 11A:
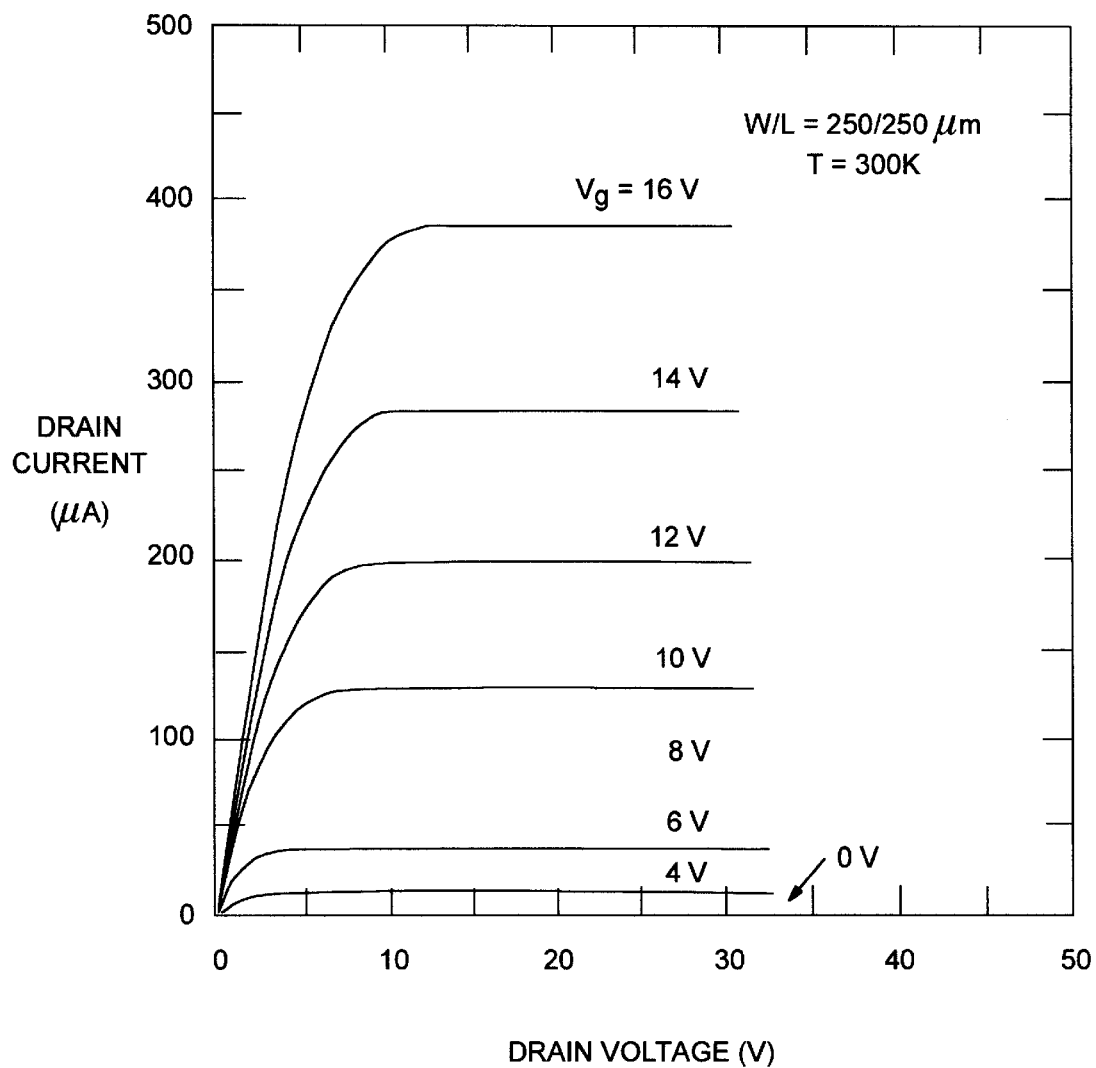
FIG. 11A is an I-V Characteristic Plot of an n-channel device according to the present invention.
Figure 11B:
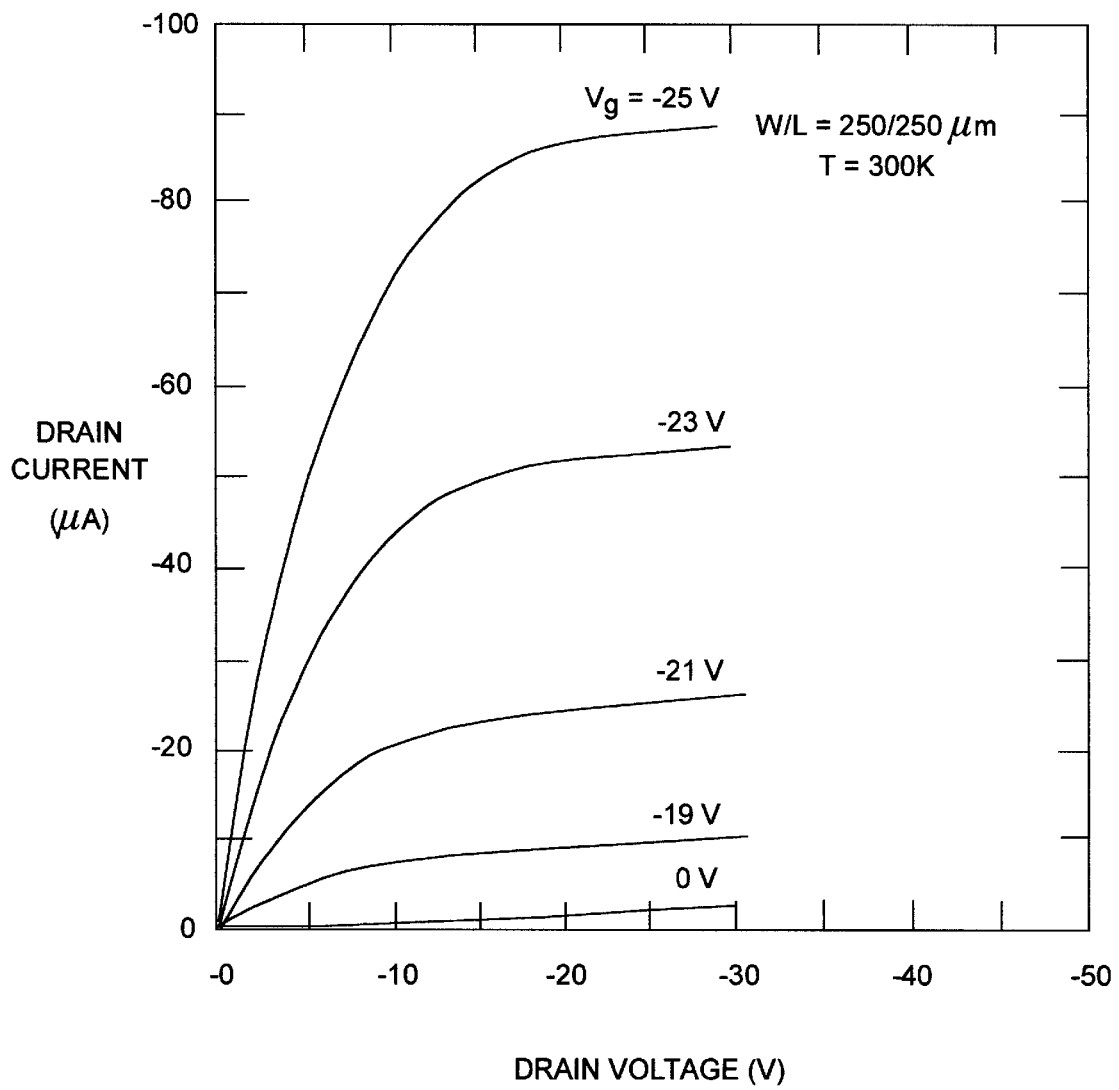
FIG. 11B is an I-V Characteristic Plot of a p-channel device according to the present invention.

The I–V characteristics of the complementary devices are shown in FIG. 11A and FIG. 11B. FIG. 11A illustrates the operational characteristics of the n-channel device formed in the well region. FIG. 11B illustrates the operational characteristics of the p-channel devices formed in the epitaxial layer. The threshold voltage of the n-channel devices was 2.5 volts and the threshold voltage of the p-channel devices was about −15 to −17 volts.

Figure 12:
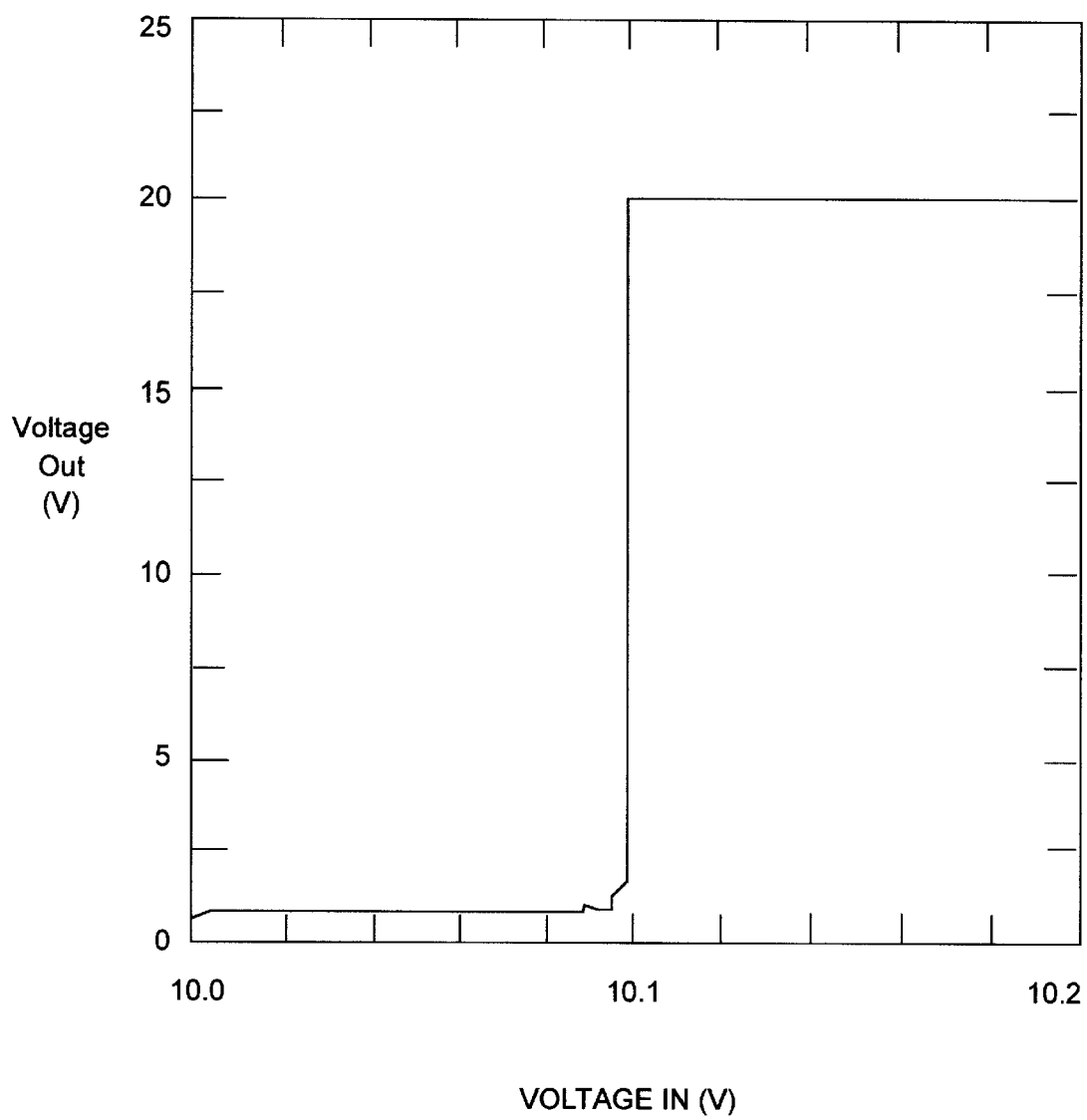
FIG. 12 is a plot of the DC transfer curve of a CMOS operational amplifier according to the present invention.

FIG. 12 is a graph of the DC transfer curve for the silicon carbide CMOS operational amplifier of FIG. 10. The open loop operational gain of the amplifier was about $10^4$ or 80 db.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A complementary MOS integrated device comprising:
   a substrate formed of silicon carbide;
   a layer of a first conductivity type silicon carbide formed on said silicon carbide substrate;
   a well region of a second conductivity type silicon carbide formed in said silicon carbide layer;
   a layer source region and a layer drain region of said second conductivity type silicon carbide formed in said silicon carbide layer;
   a well source region and a well drain region of said first conductivity type silicon carbide formed in said well region;
   a gate dielectric layer formed between said layer source and said layer drain regions and between said well source and said well drain regions;

a layer gate electrode formed on said gate dielectric layer formed between said layer source region and said layer drain region so as to provide an active channel region in said first conductivity type silicon carbide layer between said layer source and said layer drain when a bias is applied to said layer gate electrode;

a well gate electrode formed on said gate dielectric layer formed between said well source region and said well drain region so as to provide an active channel region in said second conductivity type well region between said well source and said well drain when a bias is applied to said well gate electrode;

a well source ohmic contact formed on said well source region;

a well drain ohmic contact formed on said well drain region;

a layer source ohmic contact formed on said layer source region;

a layer drain ohmic contact formed on said layer drain region; and wherein said first conductivity type and said second conductivity type are opposite conductivity type silicon carbide and wherein said layer source and drain ohmic contacts and said well source and drain ohmic contacts are formed of the same contact material.

2. The silicon carbide integrated device of claim 1, further comprising:

a well body contact formed on said well region;

a layer body contact formed on said layer of silicon carbide.

3. A silicon carbide integrated device according to claim 1, said integrated device further comprising:

an isolation layer formed on said silicon carbide layer; and metallization regions for selectively providing connection to said well source contact, gate electrode, drain and body contacts and said layer source contact, gate electrode, drain and body contacts through connection windows formed in said isolation layer.

4. A silicon carbide integrated device according to claim 3, said integrated device further comprising a protective layer formed on the exposed surfaces of said integrated device to protect said device from environmental damage.

5. A silicon carbide integrated device according to claim 4, said integrated device further comprising at least one connection pad formed in a connection pad window through said protective layer wherein said connection pad is formed on at least one of said metallization regions.

6. A silicon carbide integrated device according to claim 5, wherein said connection pad comprises:

a layer of platinum formed on said metallization region in said connection pad window; and a layer of gold formed on said layer of platinum.

7. A silicon carbide integrated device according to claim 3, wherein at least one of said metallization regions connects said well drain contact to said layer drain contact.

8. A silicon carbide integrated device according to claim 3 wherein at least one of said metallization regions is formed of molybdenum.

9. A silicon carbide integrated device according to claim 1 wherein said contact material comprises nickel.

10. A silicon carbide integrated device according to claim 1, wherein at least one of said well gate electrode, said well source region and said well drain or said layer gate electrode, said layer source region and said layer drain region are self aligned.

11. A silicon carbide integrated device according to claim 1, wherein said well gate dielectric and said layer gate dielectric layer are formed of silicon dioxide.

12. A complementary MOS integrated device according to claim 1, further comprising:

well channel stop regions formed in said well region wherein said well channel stop regions are formed of said second conductivity type silicon carbide and have a higher carrier concentration than said well region wherein said well source region and said well drain region are displaced between said well channel stop regions; and layer stop regions formed in said silicon carbide layer adjacent said layer source and said layer drain regions wherein said layer stop regions are formed of said first conductivity type silicon carbide and have a higher carrier concentration than said silicon carbide layer.

13. A complementary MOS integrated device according to claim 12 wherein said well channel stop regions are formed entirely within said well region.

14. A complementary MOS integrated device comprising:

a layer of a first conductivity type silicon carbide;

a well region of a second conductivity type silicon carbide formed in said silicon carbide layer to a depth corresponding to a maximum ion implantation energy of greater than about 250 kev and wherein an implant impurity concentration increases with depth;

a layer source region and a layer drain region of said second conductivity type silicon carbide formed in said silicon carbide layer;

a well source region and a well drain region of said first conductivity type silicon carbide formed in said well region;

a gate dielectric layer formed between said layer source and said layer drain regions and between said well source and said well drain regions;

a layer gate electrode formed on said gate dielectric layer formed between said layer source region and said layer drain region, so as to provide an active channel region in a portion of said first conductivity type silicon carbide layer extending opposite said layer gate electrode when a bias is applied to said layer gate electrode;

a well gate electrode formed on said gate dielectric layer formed between said well source region and said well drain region so as to provide an active channel region in said second conductivity type well region between said well source and said well drain when a bias is applied to said well gate electrode;

a well source ohmic contact formed on said well source region;

a well drain ohmic contact formed on said well drain region;

a layer source ohmic contact formed on said layer source region;

a layer drain ohmic contact formed on said layer drain region; and wherein said first conductivity type and said second conductivity type are opposite conductivity type silicon carbide and wherein said layer source and drain ohmic contacts and said well source and drain ohmic contacts are formed of nickel.

15. A CMOS integrated circuit according to claim 14, wherein the well region has a carrier concentration of greater than about $10^{15}$ carriers per $cm^3$.

16. A CMOS integrated circuit according to claim 14, wherein the well region has an impurity concentration profile corresponding to implantation at a plurality of implantation energies.

17. A complementary MOS integrated device according to claim 14, further comprising:
- well channel stop regions formed in said well region wherein said well channel stop regions are formed of said second conductivity type silicon carbide and have a higher carrier concentration than said well region wherein said well source region and said well drain region are displaced between said well channel stop regions;
- layer stop regions formed in said silicon carbide layer adjacent said layer source and said layer drain regions wherein said layer stop regions are formed of said first conductivity type silicon carbide and have a higher carrier concentration than said silicon carbide layer;
- an isolation layer formed on said silicon carbide layer; and
- a metallization region that provides electrical connection between said well source contact and at least one of said well channel stop regions through connection windows formed in said isolation layer.

18. A complementary MOS integrated device according to claim 17 wherein said well channel stop regions are formed entirely within said well region.

* * * * *